(12) United States Patent
Farrell et al.

(10) Patent No.: US 11,567,407 B2
(45) Date of Patent: Jan. 31, 2023

(54) METHOD FOR GLOBALLY ADJUSTING SPACER CRITICAL DIMENSION USING PHOTO-ACTIVE SELF-ASSEMBLED MONOLAYER

(71) Applicant: Tokyo Electron Limited, Tokyo (JP)

(72) Inventors: Richard Farrell, Nassau, NY (US); Hoyoung Kang, Schenectady, NY (US); David L. O'Meara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 318 days.

(21) Appl. No.: 16/586,011

(22) Filed: Sep. 27, 2019

(65) Prior Publication Data
US 2020/0103755 A1     Apr. 2, 2020

Related U.S. Application Data

(60) Provisional application No. 62/738,117, filed on Sep. 28, 2018.

(51) Int. Cl.
*G03F 7/11*     (2006.01)
*H01L 21/027*   (2006.01)
(Continued)

(52) U.S. Cl.
CPC ............... *G03F 7/11* (2013.01); *G03F 7/038* (2013.01); *G03F 7/039* (2013.01); *G03F 7/16* (2013.01);
(Continued)

(58) Field of Classification Search
CPC ........ G03F 7/16; G03F 7/165; G03F 7/70616; H01L 29/6653
See application file for complete search history.

(56) References Cited

U.S. PATENT DOCUMENTS

| 7,531,293 B2 | 5/2009 | Afzali-Ardakani et al. |
| 8,273,886 B2 | 9/2012 | Afzali-Ardakani et al. |

(Continued)

FOREIGN PATENT DOCUMENTS

JP     2016-532311 A     10/2016

OTHER PUBLICATIONS

Lapedus, Mark, "Where Is Selective Deposition?", Jun. 25, 2028, Semconductor Engineering, https://semiengineering.com/what-happened-to-selective-deposition/ (Year: 2018).*

(Continued)

*Primary Examiner* — Duane Smith
*Assistant Examiner* — Nicholas E Brown
(74) *Attorney, Agent, or Firm* — Oblon, McClelland, Maier & Neustadt, L.L.P.

(57) ABSTRACT

A method of processing a substrate includes: providing structures on a surface of a substrate; depositing a self-assembled monolayer (SAM) over the structures and the substrate, the SAM being reactive to a predetermined wavelength of radiation; determining a first pattern of radiation exposure, the first pattern of radiation exposure having a spatially variable radiation intensity across the surface of the substrate and the structures; exposing the SAM to radiation according to the first pattern of radiation exposure, the SAM being configured to react with the radiation; developing the SAM with a predetermined removal fluid to remove portions of the SAM that are not protected from the predetermined fluid; and depositing a spacer material on the substrate and the structures, the spacer material being deposited at varying thicknesses based on an amount of the SAM remaining on the surface of the substrate and the structures.

18 Claims, 12 Drawing Sheets

(51) Int. Cl.
- *G03F 7/16* (2006.01)
- *G03F 7/038* (2006.01)
- *G03F 7/30* (2006.01)
- *G03F 7/039* (2006.01)
- *G03F 7/20* (2006.01)

(52) U.S. Cl.
CPC .............. *G03F 7/2002* (2013.01); *G03F 7/30* (2013.01); *H01L 21/0274* (2013.01)

(56) References Cited

U.S. PATENT DOCUMENTS

| | | |
|---|---|---|
| 8,828,876 B2 | 9/2014 | Horak et al. |
| 9,646,898 B2 | 5/2017 | Devilliers et al. |
| 9,735,067 B2 | 8/2017 | Devilliers et al. |
| 9,977,339 B2 | 5/2018 | Devilliers et al. |
| 9,984,877 B2 | 5/2018 | Bergendahl et al. |
| 9,991,117 B2 | 6/2018 | Bergendahl et al. |
| 10,026,615 B2 | 7/2018 | Bergendahl et al. |
| 10,163,633 B2 | 12/2018 | Law et al. |
| 10,211,055 B2 | 2/2019 | Bergendahl et al. |
| 10,217,634 B2 | 2/2019 | Bergendahl et al. |
| 10,490,402 B2 | 11/2019 | Somervell et al. |
| 2007/0278179 A1 | 12/2007 | Afzali-Ardakani et al. |
| 2008/0268582 A1* | 10/2008 | Arai .................... H01L 51/0023 438/151 |
| 2008/0318157 A1 | 12/2008 | Afzali-Ardakani et al. |
| 2012/0308933 A1 | 12/2012 | Afzali-Ardakani et al. |
| 2013/0295779 A1* | 11/2013 | Chandra ........... H01L 21/02274 438/790 |
| 2014/0190935 A1 | 7/2014 | Horak et al. |
| 2015/0064917 A1 | 3/2015 | Somervell et al. |
| 2015/0212421 A1* | 7/2015 | deVilliers ........... G03F 7/70425 430/325 |
| 2016/0147164 A1* | 5/2016 | deVilliers ............ G02B 26/085 156/345.24 |
| 2017/0330753 A1 | 11/2017 | Bergendahl et al. |
| 2017/0330754 A1 | 11/2017 | Bergendahl et al. |
| 2017/0330755 A1 | 11/2017 | Bergendahl et al. |
| 2017/0330972 A1* | 11/2017 | Kloster ............. H01L 21/31133 |
| 2018/0053840 A1* | 2/2018 | Mallela ............. H01L 29/66666 |
| 2018/0190491 A1 | 7/2018 | Bergendahl et al. |
| 2018/0197739 A1 | 7/2018 | Bergendahl et al. |
| 2018/0261457 A1 | 9/2018 | Law et al. |

OTHER PUBLICATIONS

Warner, Ellis et al., "Atomic layer deposition of zinc oxide: Understanding the reactions of ozone with diethylzinc", May 21, 2013, Journal of Vacuum Science & Technology A 31, 041504 (2013) https://doi.org/10.1116/1.4806800 (Year: 2013).*

International Search Report and Written Opinion of the International Searching Authority dated Jan. 13, 2020 in PCT/US2019/053504, 9 pages.

Hui Zhao, et al., "o-Nitrobenzyl Alcohol Derivatives: Opportunities in Polymer and Materials Science", Macromolecules, vol. 45, 2012, pp. 1723-1736.

Steven M. George, "Atomic Layer Deposition: An Overview", Chemical Reviews, vol. 110, No. 1, 2010, pp. 111-131.

* cited by examiner

BACKGROUND

BACKGROUND

LEFT ←——————→ RIGHT

LEFT ← → RIGHT

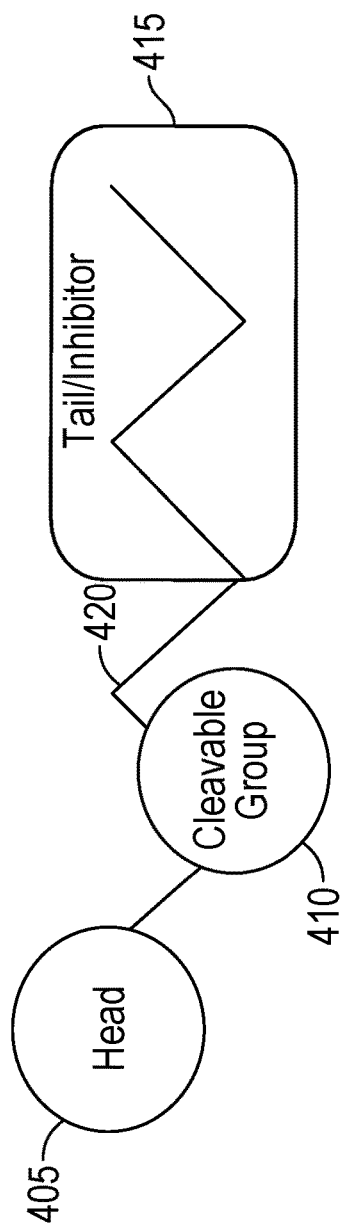
FIG. 4A
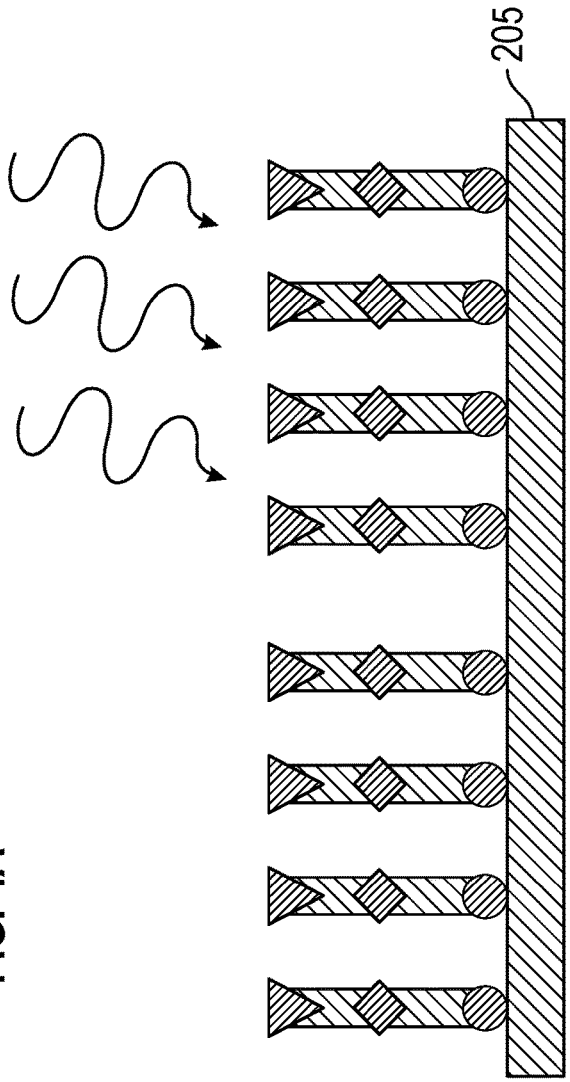
FIG. 4B
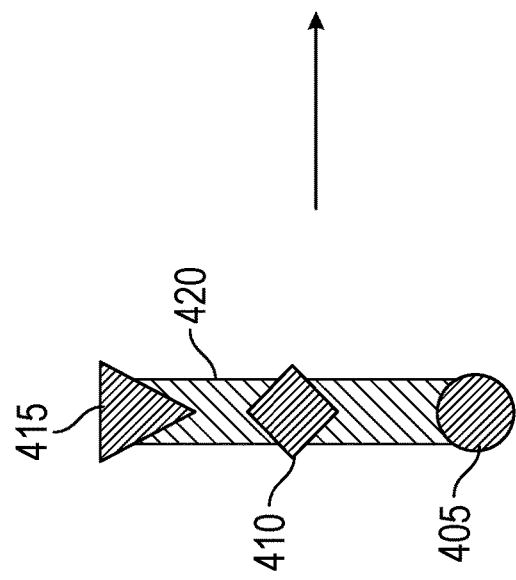

Example Body Groups:
Aliphatic $HS(CH_2)_nCH_3$

Aromatic $HS(C_6H_4)_nC_6H_5$

Flurinated Aliphatic $HS(CH_2)_nCH_3$

METHOD FOR GLOBALLY ADJUSTING SPACER CRITICAL DIMENSION USING PHOTO-ACTIVE SELF-ASSEMBLED MONOLAYER

INCORPORATION BY REFERENCE

This present disclosure claims the benefit of U.S. Provisional Application No. 62/738,117, filed on Sep. 28, 2018, which is incorporated herein by reference in its entirety.

FIELD OF THE INVENTION

The present disclosure relates to a method of fabrication of semiconductor devices and particularly to patterning techniques to reduce pattern/dimensional variation.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Cross-wafer critical dimension (CD) control and cross-wafer pitch walking control for multi-patterning fabrication techniques affect both edge placement error (EPE) and final device yield. Accordingly, improving control of CD and pitch walking is beneficial to successful fabrication of semiconductor devices. Techniques to minimize pitch walking can include modulate lithography CD and first mandrel SADP (self-aligned double patterning). Some approaches to control pitch walking at the SAQP (self-aligned quadruple patterning) stage can be either too complex (precise etch and temperature control) or have limited correction capabilities (mapping doses via a photolithography scanner). Thus, a solution to controlling either spacer or mandrel CD at a final SAQP processing stage is desired.

SUMMARY

The present disclosure relates to a method of processing a substrate, including: providing structures on a surface of a substrate; depositing a self-assembled monolayer (SAM) over the structures and the substrate, the SAM being reactive to a predetermined wavelength of radiation; determining a first pattern of radiation exposure, the first pattern of radiation exposure having a spatially variable radiation intensity across the surface of the substrate and the structures; exposing the SAM to radiation according to the first pattern of radiation exposure, the SAM being configured to react with the radiation; developing the SAM with a predetermined removal fluid to remove portions of the SAM that are not protected from the predetermined fluid; and depositing a spacer material on the substrate and the structures, the spacer material being deposited at varying thicknesses based on an amount of the SAM remaining on the surface of the substrate and the structures.

The disclosure additionally relates to a method of processing a substrate, including: providing structures on a surface of a substrate; depositing a self-assembled monolayer (SAM) over the structures and the substrate, the SAM being reactive to a predetermined wavelength of radiation; determining a first pattern of radiation exposure, the first pattern of radiation exposure having a spatially variable radiation intensity across the surface of the substrate and the structures; exposing the SAM to radiation according to the first pattern of radiation exposure, the SAM being configured to react with the radiation; developing the SAM with a predetermined removal fluid to remove portions of the SAM that were exposed to the first pattern of radiation exposure; and depositing a spacer material on the substrate and the structures, the spacer material being deposited at varying thicknesses based on an amount of the SAM remaining on the surface of the substrate and the structures Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 4A shows an example molecule structure for a SAM, according to an embodiment of the present disclosure.

FIG. 4B shows a schematic of a SAM molecule covering a substrate and receiving electromagnetic radiation having a predetermined wavelength of light, according to an embodiment of the present disclosure.

DETAILED DESCRIPTION

Figure 1A:
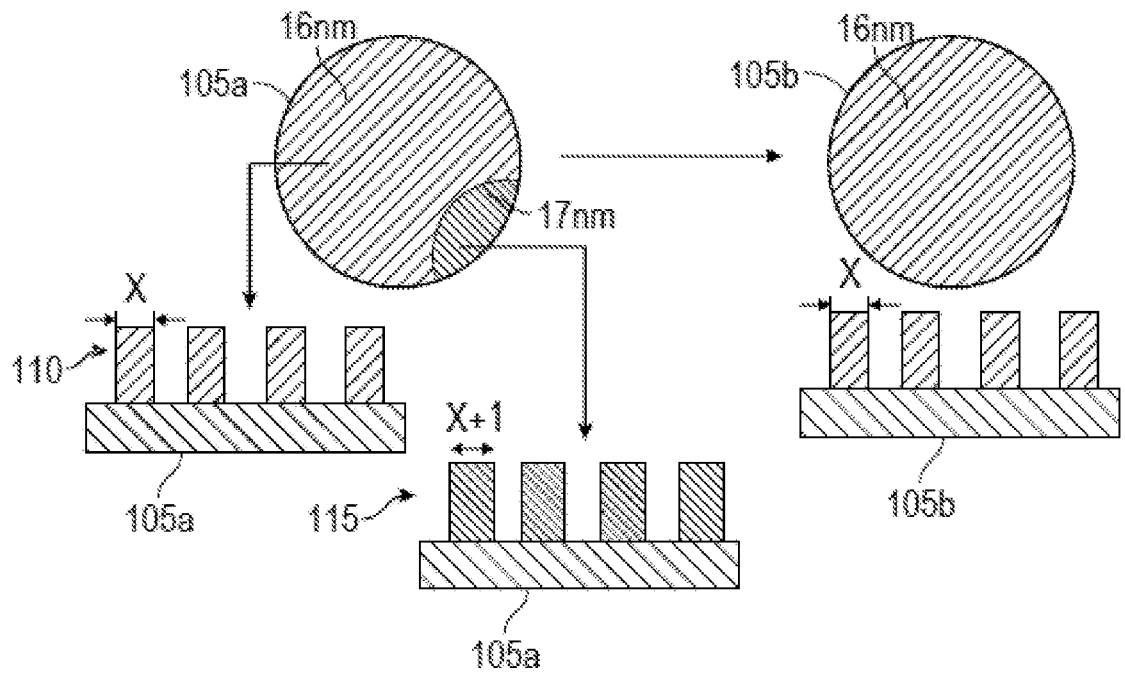
FIG. 1A shows a schematic of a non-uniform spacer CD, according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein enable critical dimension (CD) and pitch walking control at multi-patterning stages. This technique uses light projection hardware to deliver an adjustable dose to specific locations on a wafer. The light projection hardware can be a direct-write system, with lateral resolution between 0.1 to 500 microns or smaller. Note that resolutions larger than 500 microns can be used and can provide utility, but resolutions smaller than about 500 microns provide increased benefits. Resolutions less than 1 micron can also be used depending on conventionally available direct-write optics. The spatially adjustable light dose can be selected to photo-decompose a self-absorbed monolayer previously deposited on the substrate features. Such light can have a wavelength(s) between 10 to 1000 nanometers. A remaining monolayer can then function as a nucleation inhibiter, thereby reducing a final CD of corresponding spacers (spacer modulation).

FIG. 1A shows a schematic of a non-uniform spacer CD, according to an embodiment of the present disclosure. A substrate 105a can include a first patterned structure 110 and a second patterned structure 115 provided on the surface of the substrate 105a. For example, the first patterned structure 110 on the substrate 105a can be lines or fins or part of a self-aligned double patterning and/or self-aligned quadruple patterning (SADP and/or SAQP) process. Note that on the substrate 105a, some areas of the substrate 105a have CD values of 16 nm, for example the first patterned structure 110, while other areas have CD values of 17 nm, for example the second patterned structure 115. Thus, the first patterned structure 110 and the second patterned structure 115 result in non-uniformity on the substrate 105a. Using, for example, selective de-protection of a monolayer deposited on mandrels, a SAQP process can result in an optimized substrate 105b, wherein the optimized substrate 105b includes uniform CDs across the optimized substrate 105b surface. For example, all areas of the optimized substrate 105b can include the first patterned structure 110.

Figure 1B:
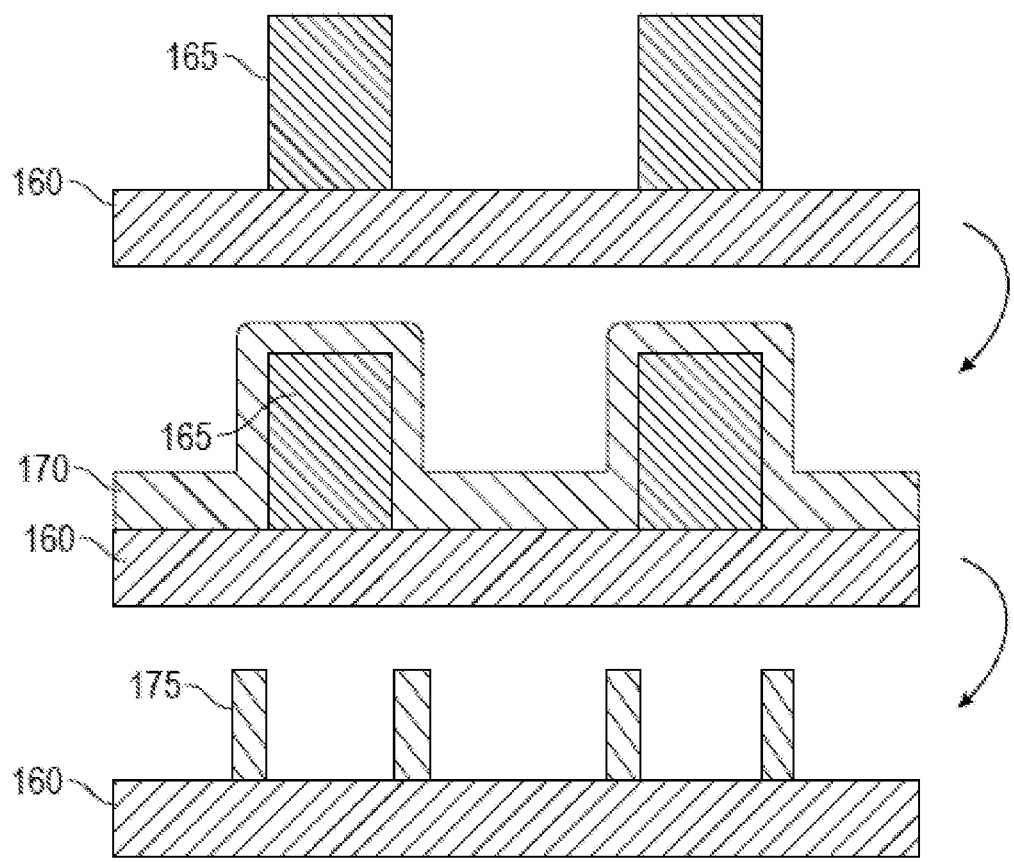
FIG. 1B shows a simplified cross-sectional schematic of a self-aligned double patterning (SADP) process, according to an embodiment of the disclosure.

FIG. 1B shows a simplified cross-sectional schematic of a self-aligned double patterning (SADP) process, according to an embodiment of the present disclosure. A brief process flow is described as follows. First, mandrels 165 can be formed on a surface of a substrate 160. For example, the mandrel 165 pattern can be defined with a mask and formed via etching. Subsequently, a spacer layer 170 can be deposited over the substrate 160 and mandrels 165. The spacer layer 170 can be etched to recess the spacer layer 170 below a height of the mandrels 165 and wherein the spacer layer 170 material adjacent to the mandrels 165 and on the surface of the substrate 160 is removed entirely. The mandrels 165 can then be removed to leave spacers 175 (resembling posts as shown) remaining on the surface. The spacer layer 170 deposition over the spacers 175 and spacer layer 170 etching can be repeated again if desired to yield the SAQP process, wherein the spacer layer 170 material may be a different material for the repeated step. Notably, these processes performed over the entire surface of the substrate 160 may yield non-uniformities as previously described in FIG. 1A, and repeating the process for the quadruple patterning process may further propagate any non-uniformities introduced at the double patterning stage. Thus, a method to correct said non-uniformities is desired.

In an embodiment, a light-sensitive molecule can be attached to structures on a substrate. Such structures can be lines, mandrels, spacers, fins, mesas, etc. The light-sensitive molecule can be attached by vapor deposition or spin-on deposition. Spin-on deposition can be used if the resulting deposition is conformal instead of leaving openings filled with material.

With a light-sensitive molecule or self-assembled monolayer (SAM) adhered to surfaces of the substrate, activating light can be applied to specific regions of the substrate identified as having higher CD values. Molecules can decompose upon interaction with the activating light. Decomposed, oxidized, or otherwise de-protected molecules can then be remove with an appropriate solvent, base, or other removing fluid. In locations where molecules are removed, spacer nucleation can be un-perturbed and thus results in a comparatively thicker spacer. In locations where molecules were not removed or only partially removed, the remaining film can inhibit growth of spacers during nucleation, thereby resulting in a thinner spacer as compared to surfaces without the SAM molecules. Surfaces can be modified to be hydrophobic or hydrophilic to accommodate different atomic layer deposition (ALD) spacer precursors.

Figure 2A:
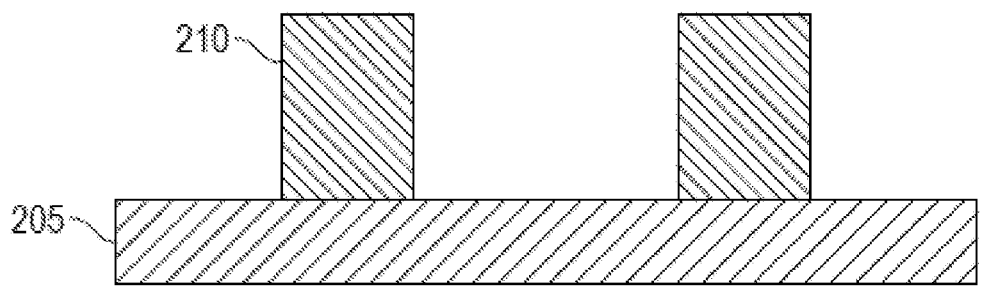
FIG. 2A shows a substrate including fabricated structures provided on a surface of the substrate, according to an embodiment of the disclosure.

FIGS. 2A-2H show cross-sectional diagrams of substrate segments in a SAQP process with spacer CD adjustment, according to an embodiment of the present disclosure. FIG. 2A shows a substrate 205 including fabricated structures 210 provided on a surface of the substrate 205, according to an embodiment of the present disclosure. The structures 210 can protrude from the substrate 205 and can be, for example, lines or mandrels.

In an embodiment, simulations of resulting structures from the patterning process can be utilized to determine areas of non-uniformity, and said areas can be targeted for adjustment. In an embodiment, the substrate 210 can be measured immediately prior to deposition. In an embodiment, the previously described SADP process (or SAQP process) can be performed at this point to yield spacers. For example, a conformal spacer deposition can be deposited on mandrels, spacer material on the mandrels and floors can be etched away to yield sidewall spacers, and then mandrels can be removed, leaving the sidewall spacers as new mandrels for additional multi-patterning. Non-uniformities from the patterning process can be determined, for example via metrology, and adjusted in subsequent processing.

Figure 2B:
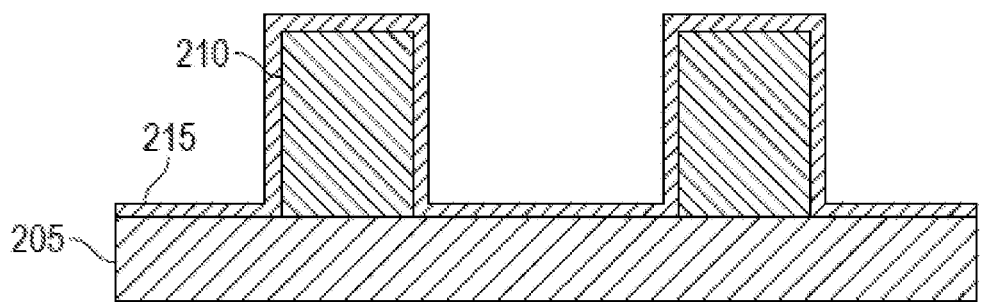
FIG. 2B shows a self-assembled monolayer (SAM) conformally deposited on the structures, according to an embodiment of the disclosure.

FIG. 2B shows a SAM 215 conformally deposited on the structures 210, according to an embodiment of the present disclosure. For example, the SAM 215 can be a monomer and/or short-chain polymer coating and can be applied utilizing, for example, vapor deposition or spin-on deposition, resulting in the monomer/polymer adsorbing to surfaces on the substrate 205. Vapor deposition processes can be executed at various temperatures, such as room temperature to 300 degrees Celsius or more. Deposition can be executed in a vacuum or at atmosphere.

By conformally depositing the SAM 215, a coating results having an approximately same thickness on all the surfaces of the structures 210 and substrate 205. Thus, both horizontal and vertical surfaces receive the SAM 215 of approximately equal thickness. Accordingly, spaces between the structures 210 can still have open space. The SAM 215, and most notably molecules in the SAM 215, can inhibit deposition of subsequent films. The molecules in the SAM 215 can be selected to have a predetermined structure (described below) that significantly impedes the path of other molecules in subsequent depositions from reaching and attaching to the surface of the substrate 205.

Figure 2C:
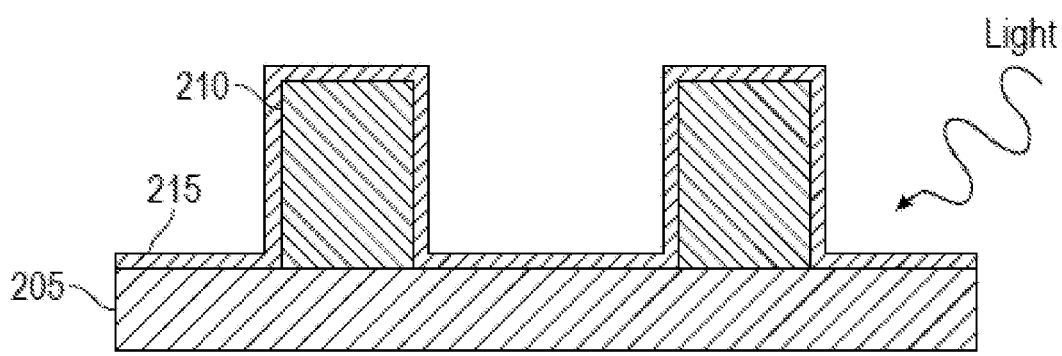
FIG. 2C shows a SAM being irradiated with light, according to an embodiment of the disclosure.

FIG. 2C shows the SAM 215 being irradiated with electromagnetic radiation, such as light; according to an embodiment of the present disclosure. In an embodiment, the SAM 215 can be reactive to a predetermined wavelength of light based on the different monomers available for use in the SAM 215. Advantageously, the monomer can be selected based on a desired wavelength of light to be used, for example in an exposure instrument. Additionally, the predetermined wavelength of light can weaken or strengthen the monomer in the SAM 215. In some embodiments, reaction with halogens can form hydrogen chloride (HCL), while reactions with a hydroxide (OH) can form water. For example, after a vapor-based attachment of the SAM 215 to the substrate, a rinse can be executed to remove any unbound polymer. Light can then irradiate predetermined target areas of the substrate. As previously described, the predetermined target areas can be determined based on simulations or metrology results that indicate CD non-uniformities are present.

In an embodiment, light can be projected onto the substrate 205 in a first pattern. The first pattern can be of the predetermined wavelength and include a light intensity that varies spatially across the surface of the substrate 205. The first pattern can be projected using, for example, a maskless projection system, such as a direct write system. This direct-write system can project a pattern all at once or scan the pattern over the wafer using a mirror projection system. The first pattern can be based on a CD signature that characterizes CD values across the substrate by coordinate locations. More or less light can thus be projected onto the substrate 205 based on the coordinate location on the substrate 205. As previously mentioned, CD signature can be based on simulations, measurements from previous substrates 205 having been processed with a same fabrication flow, or the substrate 210 can be measured immediately prior to the SAM 215 deposition. With measurement of each substrate 205, the CD signature for each substrate 205 can be different.

In an example shown in FIG. 2C, the SAM 215 covering the structure 210 on the right can be exposed to light while the SAM 215 covering the structure 210 on the left can be protected from exposure, wherein the light exposure can lead to removal of the SAM 215 in the targeted exposed areas.

Figure 2D:
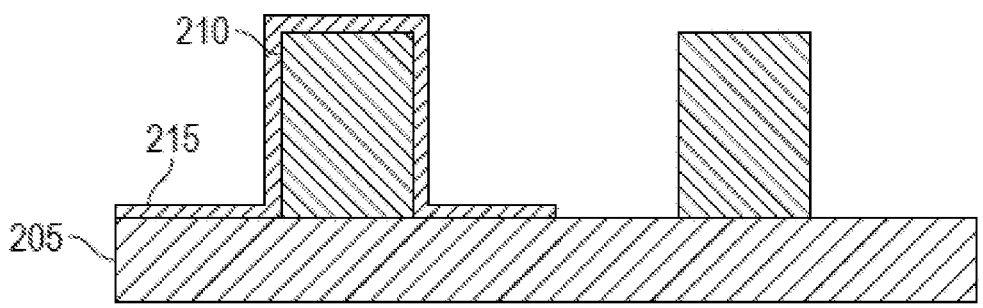
FIG. 2D shows a SAM removed from a structure, according to an embodiment of the disclosure.

FIG. 2D shows the SAM 215 removed from the structure 210, according to an embodiment of the present disclosure. The SAM 215 can react to the light according to an intensity of light received at the corresponding coordinate location. Thus, some locations may receive no light exposure, while other locations can receive full intensity light exposure, while some locations can receive a fraction of available light intensity. Notably, the photo reaction of the SAM 215 can depend on the type of monomer used as well as the predetermined wavelength of the light.

With some material and light combinations, the reaction is similar to a reaction by a predetermined removal fluid, such as solvent, base, or other developer. For example, full or partial photo oxidation of the SAM 215 molecules can result. By way of a specific example, with a wavelength of 193 nm, a particular molecule can be cleaved and cut and thus modified to be soluble or susceptible to a corresponding developer. In other embodiments, the SAM 215 reacts to the light exposure by increasing cross-linking within the SAM 215, resulting in the SAM 215 resisting removal by the predetermined removal fluid. For example, with a particular molecule, 248 nm light can be used to cross-link between molecules to increase resistance to solvents washing away the SAM 215. The predetermined wavelength of light can be, for example, 150 nm to 500 nm, or 160 nm to 450 nm, or preferably, 193 nm to 405 nm.

After light exposure, portions of the SAM 215 that are not protected from a removal fluid can be removed from the substrate 205. Depending on the SAM 215 material used and the predetermined wavelength of light used, SAM 215 portions that are not protected can be regions exposed to the first pattern of light, or regions having not been exposed to the first pattern of light. Accordingly, the result can be the structures 210 across the substrate 205 having more or less or no monomer remaining on surfaces at different coordinate locations on the substrate 205.

Figure 2E:
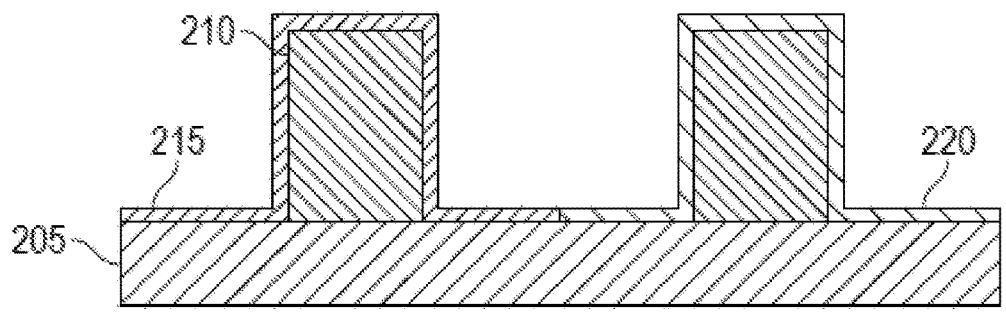
FIG. 2E shows structures after deposition or growth of a spacer material, according to an embodiment of the disclosure.

FIG. 2E shows the structures 210 after deposition or growth of a spacer material 220, according to an embodiment of the present disclosure. With a substrate 205 having varying amounts of the SAM 215 across its surface, the spacer material 220 can be deposited or grown. For example, the spacer material 220 can be deposited on the substrate 205 using a similar conformal deposition process, such as the vapor deposition. Even though the conformal deposition process is used, a resulting spacer film may not be deposited with a uniform thickness on all surfaces. Thus, the result is the spacer material 220 being deposited with varying thickness based on an amount of the SAM 215 remaining on a corresponding surface. For example, the spacer material 220 can be deposited at a greater thickness in areas with comparatively less SAM 215 still attached to the structures 210. In an embodiment, the spacer material 220 can be deposited at a greater thickness in areas with comparatively more SAM 215 still attached to the structures 210 and surface of the substrate 205, depending on hydrophobicity of the SAM 215 material compared to a material of the structures 210.

In an embodiment, plasma enhanced or ozone processes used in atomic layer deposition (ALD) can be used to facilitate additional etching of the SAM 215. For example, the SAM 215 can have a substantially dense arrangement of molecules that prevent molecules in the spacer material 220 deposition from penetrating the SAM 215 and attaching to the surfaces. Thus, the higher energy of the plasma enhanced or ozone used in the ALD can remove additional SAM 215 material in order to allow the spacer material 220 to deposit and grow. The plasma or ozone processes can be used independent of the full ALD cycle to remove or slim the SAM 215 prior to the full ALD cycles of deposition. Alternately, selective atomic layer etching (ALE) or other selective etching methods could be used independent of the deposition step to modify the SAM 215 film.

Figure 2F:
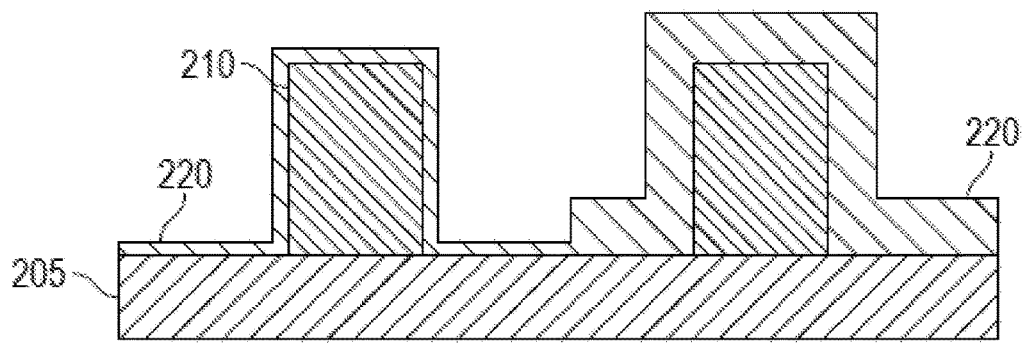
FIG. 2F shows spacer material with different thicknesses over structures based on underlying amounts of a remaining SAM, according to an embodiment of the disclosure.

FIG. 2F shows the spacer material 220 with different thicknesses over the structures 210 based on underlying amounts of the remaining SAM 215. Notably, the SAM 215 may slow the deposition or growth of the spacer material 220, but not prevent it entirely. Thus, after a delay, the spacer material 220 can eventually still deposit or grow over the area where the SAM 215 was still present after exposure to the light. As shown in FIG. 2F, the structure 210 on the left, which previously included the SAM 215 layer, begins to form the spacer material 220, which can have a thinner thickness than the spacer material 220 on the structure 210 on the right.

Figure 2G:
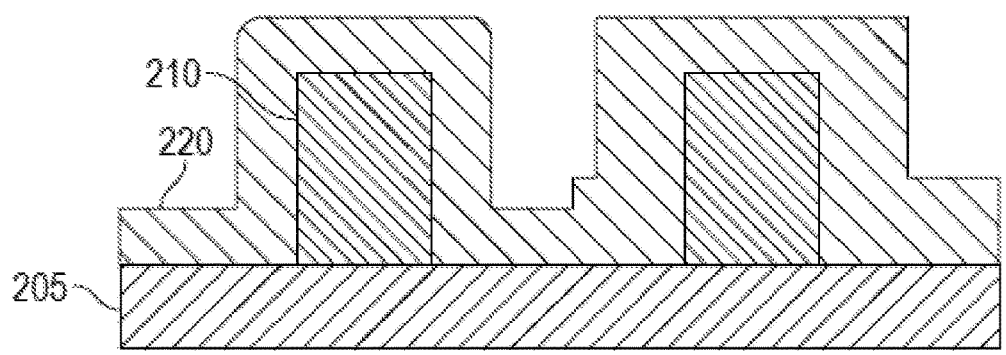
FIG. 2G shows spacer material after deposition or growth, according to an embodiment of the disclosure.

FIG. 2G shows the spacer material 220 after deposition or growth, according to an embodiment of the present disclosure. As shown, due to the delay in the start of growth or deposition on the structure 210 on the left, the thickness of the spacer material 220 after the growth or deposition has finished is thinner as compared to the spacer material 220 on the structure 210 on the right.

Figure 2H:
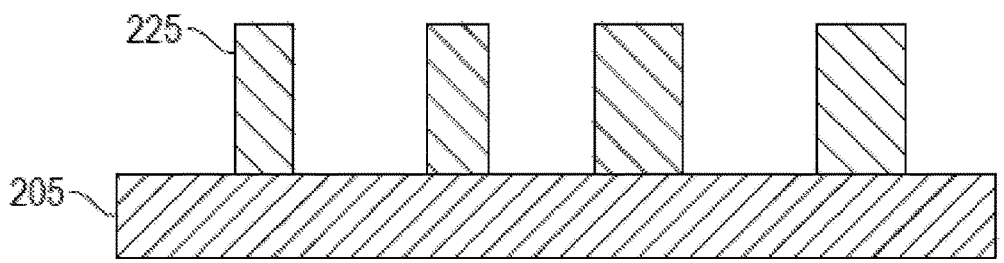
FIG. 2H shows the formation of spacer posts, according to an embodiment of the disclosure.

FIG. 2H shows the formation of spacer posts 225, according to an embodiment of the present disclosure. The spacer material 220 in FIG. 2G can be recessed down below the top of the structure 210, for example via an etch, in order to expose the surface of the substrate 205 and the top of the structures 210. The structures 210 can be removed, for example via a selective etch, and the spacer posts 225 can remain on the substrate 205. Notably, the pair of spacer posts 225 on the right were formed from the spacer material 220 that grew or deposited on the area where SAM 215 was removed, and thus the spacer material 220 was thicker, leading to spacer posts 225 with a greater thickness along an east/west or left/right direction parallel to the surface of the substrate 205 as well. Concomitantly, the pair of spacer posts 225 on the left are thinner (along an east/west or left/right direction parallel to the surface of the substrate 205) as compared to the pair of spacer posts 225 on the right since the growth of the spacer material 220 was inhibited by the SAM 215, thus delaying the growth of the spacer material 220 on the left.

In some embodiments, a non-exposed region in which the SAM 215 remains on the structures 210 can result in a hydrophobic surface. The resulting SAM 215 includes areas with untouched SAM 215 having alkane chains extending outwards. For regions exposed to the activating light wavelength, the surfaces of these regions can be hydrophilic. Most of a polymer chain can be removed and the remaining component (underlying surface or damaged polymer) can be hydrophilic. For a subsequent spacer deposition process, an ALD/CVD deposition can be inhibited on the non-exposed region. Initial ALD growth can be optimized for this inhibition process (for example, no Ozone or 02 plasma).

Figure 3:
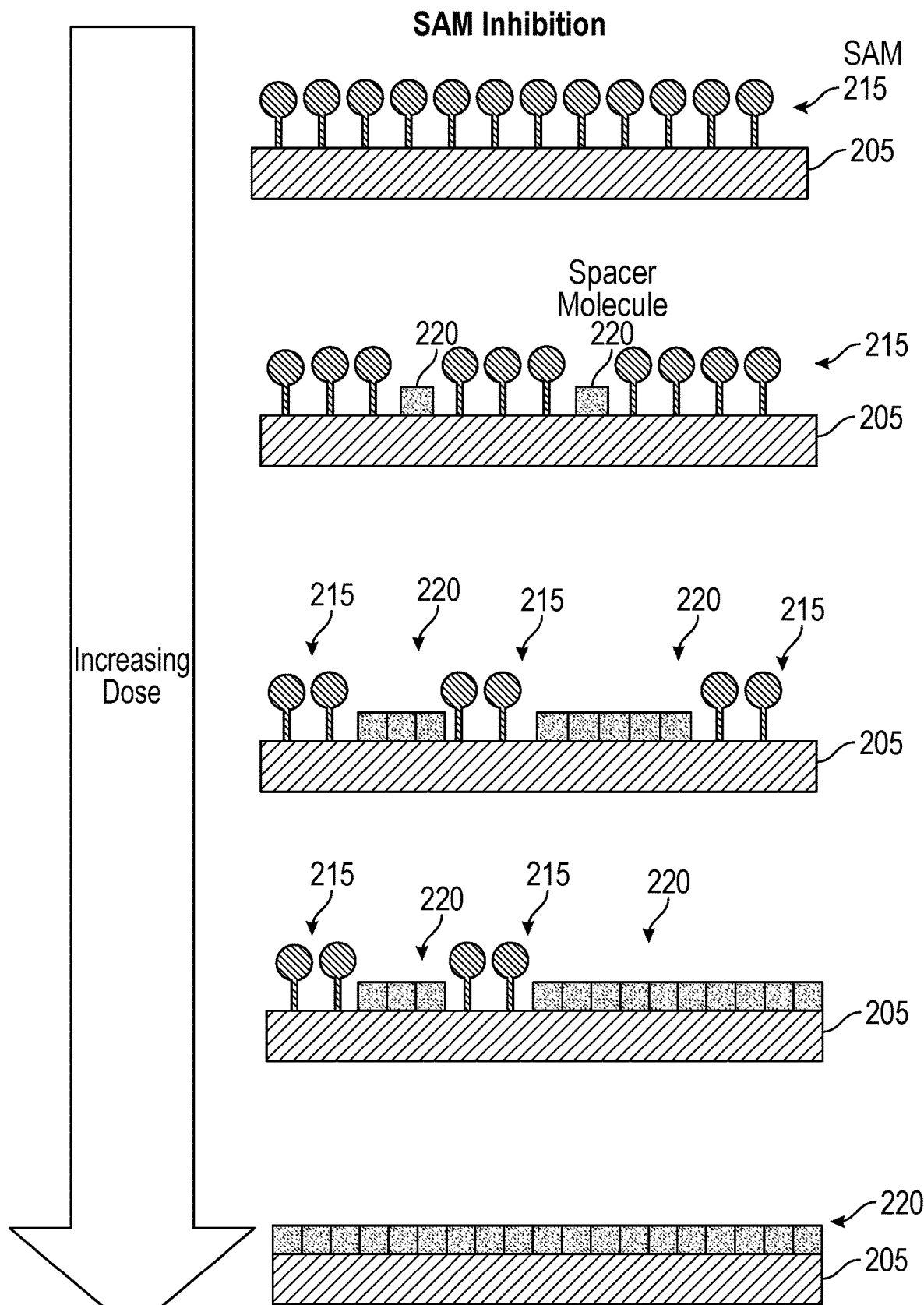
FIG. 3 shows how various amounts of a SAM can be removed from surfaces depending on light intensity, according to an embodiment of the present disclosure.

Techniques herein thus provide spatial control over a deposited spacer post 225 thickness. As an applied dose of light increases, the SAM 215 coverage decreases, resulting in a greater final spacer post 225 thickness. Thus, a pixel-based light exposure can be used to modulate loss of the SAM 215, which in turn provides controllable nucleation inhibition of the spacer material 220. FIG. 3 illustrates how various amounts of the SAM 215 can be removed from surfaces depending on light intensity, according to an embodiment of the present disclosure. Accordingly, varying delay of growth or deposition of the spacer material 220 occurs, which can lead to multiple different spacer post 225 thicknesses at different coordinate locations on the substrate 205. It should be noted that even the top-most schematic in FIG. 3 will eventually yield nucleation of the spacer material 220 as the molecules from the spacer material 220 can penetrate through the molecules of the SAM 215 and attach to the surface. Thus, the SAM 215 can serve to delay rather than entirely prevent growth or deposition of the spacer material 220. A thickness of the deposited SAM 215 can vary by application. Depending on the application, the thickness of the SAM 215 can be, for example, 0.1 nm to 500 nm, or 0.25 nm to 25 nm, or preferably, 0.4 nm to 2 nm.

Figure 4C:
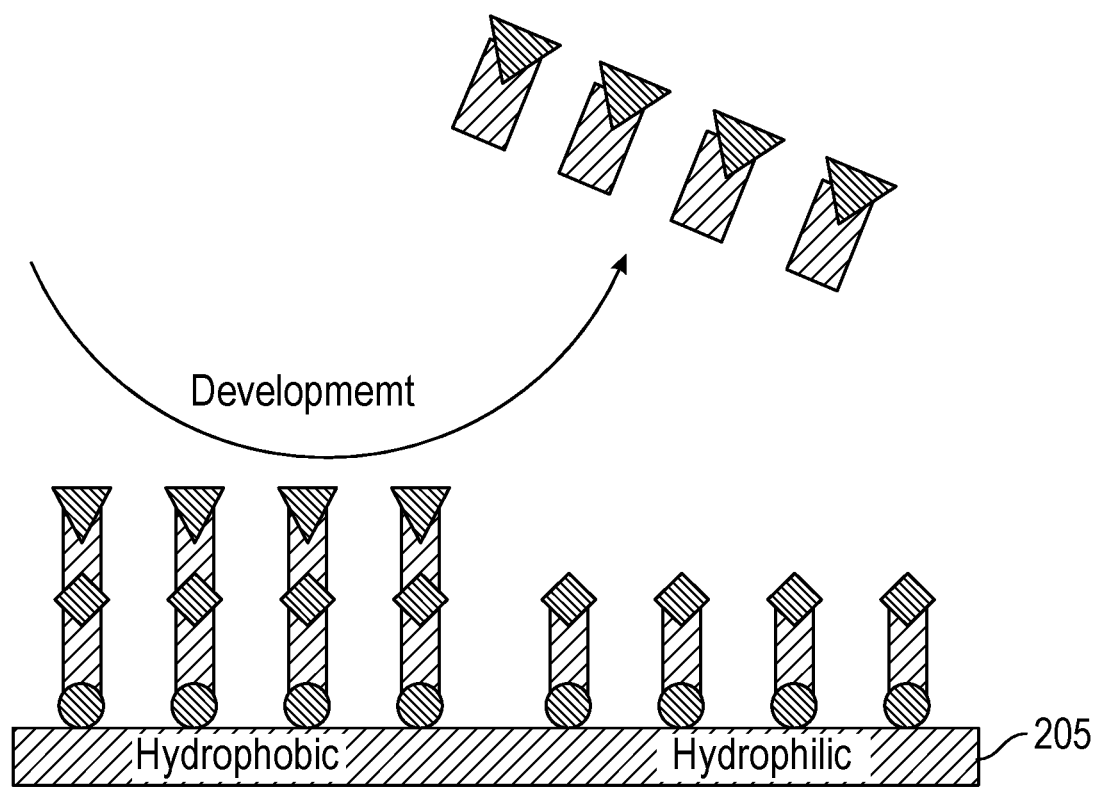
FIG. 4C shows development of a SAM after irradiation, according to an embodiment of the present disclosure.
Figure 4D:
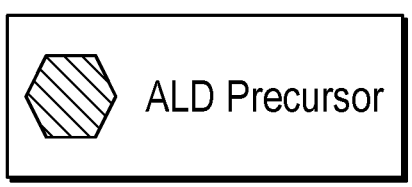
FIG. 4D shows a SAM interacting with other molecules, according to an embodiment of the present disclosure.
Figure 4D:
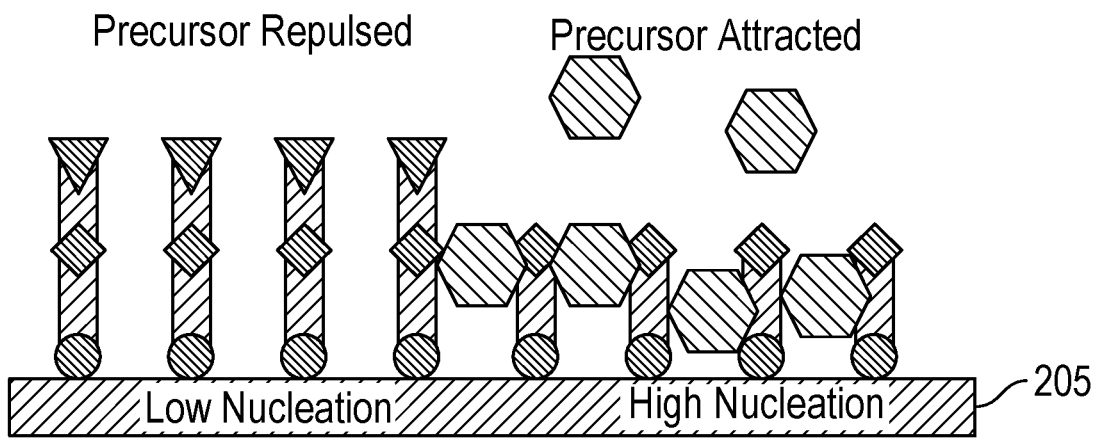
Figure 4E:
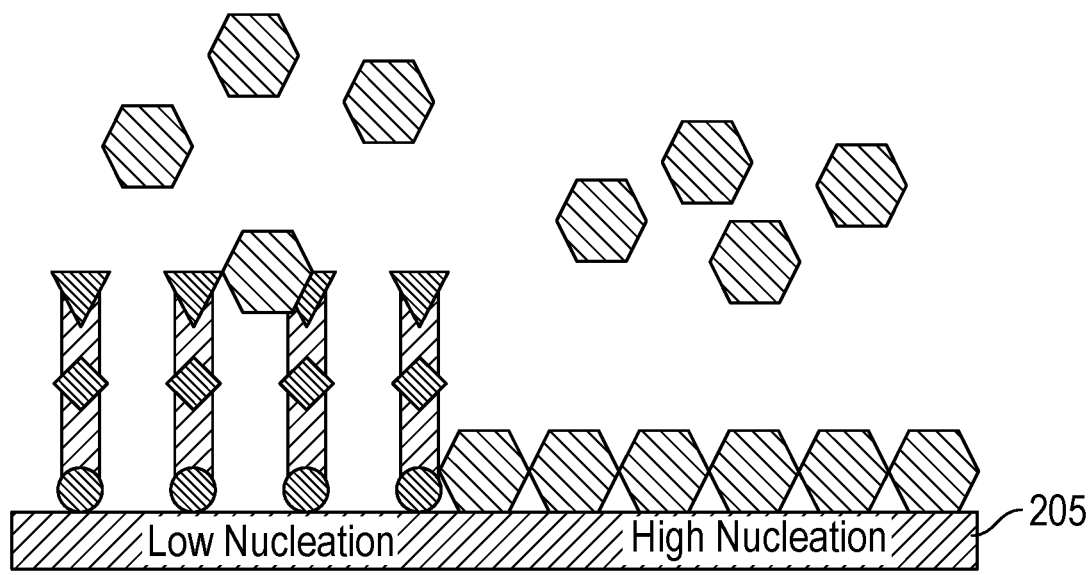
FIG. 4E shows penetration of ALD precursor molecules through an uncleaved SAM, according to an embodiment of the present disclosure.
Figure 4F:
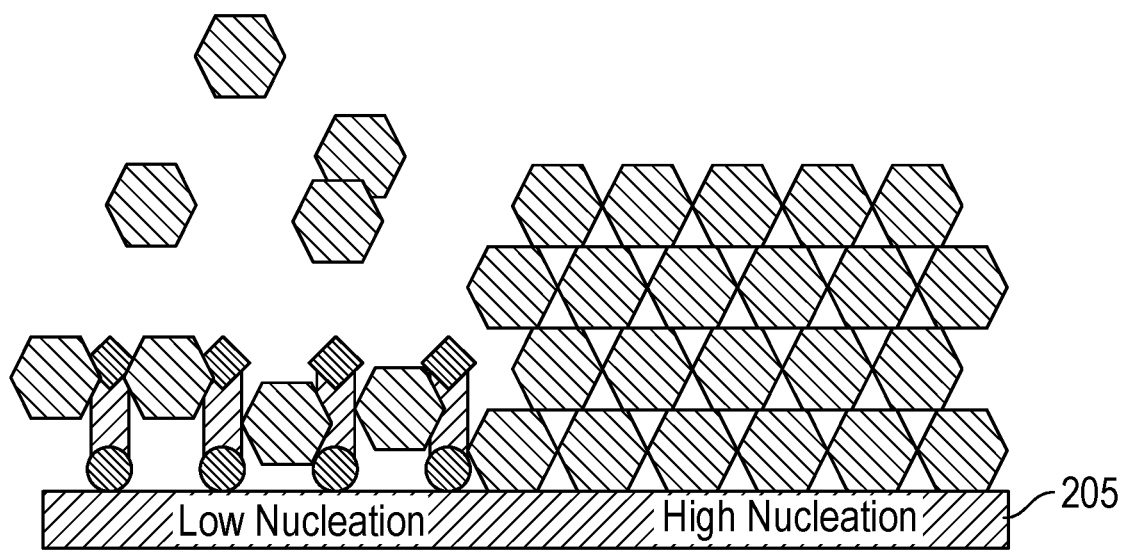
FIG. 4F shows additional penetration and growth of ALD precursor molecules, according to an embodiment of the present disclosure.
Figure 4G:
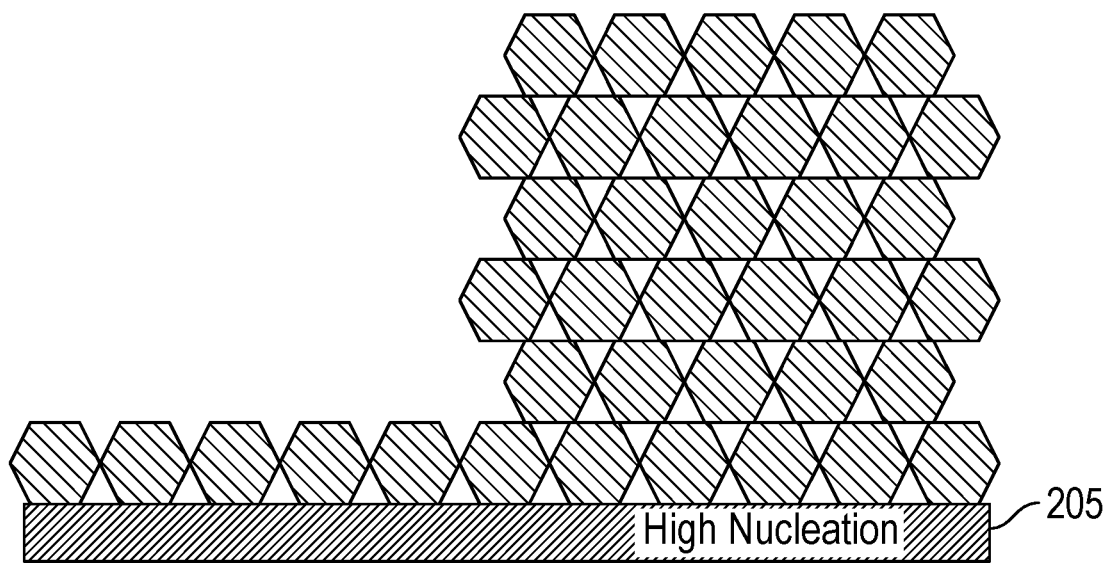
FIG. 4G shows growth of a first and second film after displacement of a SAM, according to an embodiment of the present disclosure.

Note that various materials can be used for executing techniques herein. FIG. 4A shows an example molecule structure for the SAM 215, according to an embodiment of the present disclosure. The SAM 215 molecule can include a head 405, a cleavable group 410, a tail/inhibitor 415, and a body 420. FIGS. 4B-4G show more in-depth non-limiting examples of the critical dimension adjustment. FIG. 4B shows a schematic of the SAM 215 molecule covering the substrate 205 and receiving the electromagnetic radiation having the predetermined wavelength of light, according to an embodiment of the present disclosure. The electromagnetic radiation can target the right side of the SAM 215 and substrate 205, as shown. FIG. 4C shows development of the SAM 215 after irradiation, according to an embodiment of the present disclosure. In an embodiment, the irradiated area of the SAM 215 can de-protect the SAM 215 from the predetermined removal fluid. Thus, the SAM 215 molecules on the right side of FIG. 4C can be cleaved and removed. FIG. 4D shows the SAM 215 interacting with other molecules, according to an embodiment of the present disclosure. ALD precursor molecules can be introduced to induce nucleation on the substrate 205. In an embodiment, the ALD precursor molecules can more easily penetrate through the cleaved area of the SAM 215 and attach to the surface of the substrate 205. FIG. 4E shows penetration of the ALD precursor molecules through the uncleaved SAM 215, according to an embodiment of the present disclosure. While the uncleaved area of the SAM 215 can hinder penetration of the ALD precursor molecules, over time the ALD precursor molecules can eventually penetrate through and attach to the surface of the substrate 205. Notably, the ALD precursor molecules on the right side (cleaved SAM 215 area) can displace and cause detachment of the SAM 215 molecules after nucleation exceeds a predetermined threshold. FIG. 4F shows additional penetration and growth of the ALD precursor molecules, according to an embodiment of the present disclosure. A first film of the ALD precursor molecules on the right can steadily increase in thickness while the ALD precursor molecules on the left side (uncleaved SAM 215 area) can begin to form a second film. FIG. 4G shows growth of the first and second film after displacement of the SAM 215, according to an embodiment of the present disclosure. As shown, the right side having less impediments to growth can yield the first film, which is thicker than the second film on the left side. Notably, the SAM 215 molecules can be displaced and the first and second films can begin unimpeded growth. In an embodiment, the first film (thicker side) can, proceeding forward, increase in thickness at a rate substantially equal to the second film's (thinner side) since the SAM 215 no longer impedes attachment or growth.

Figure 5A:
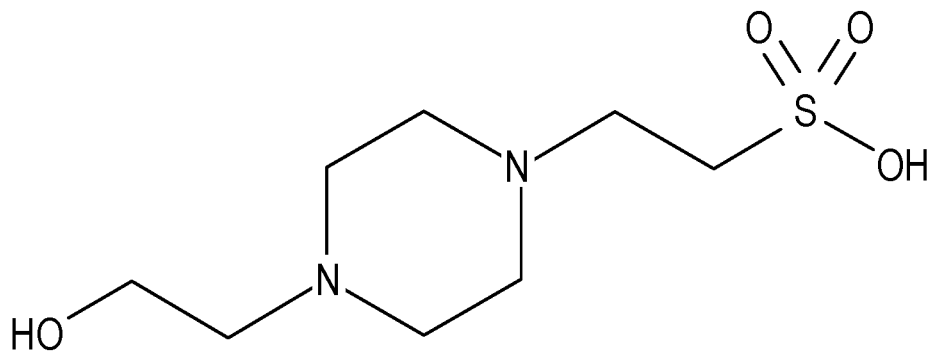
FIG. 5A shows an example of a head and tail group, according to an embodiment of the present disclosure.
Figure 5B:
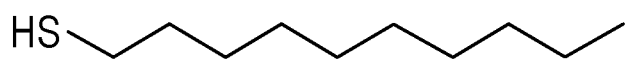
FIG. 5B shows examples of a body group, according to an embodiment of the present disclosure.
Figure 5B:
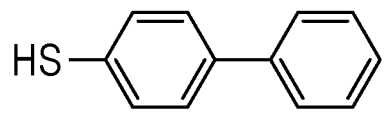
Figure 5B:
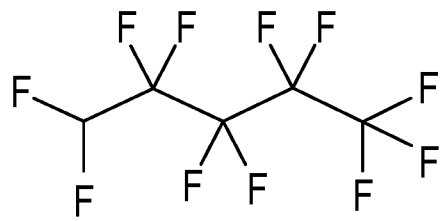
Figure 5C:
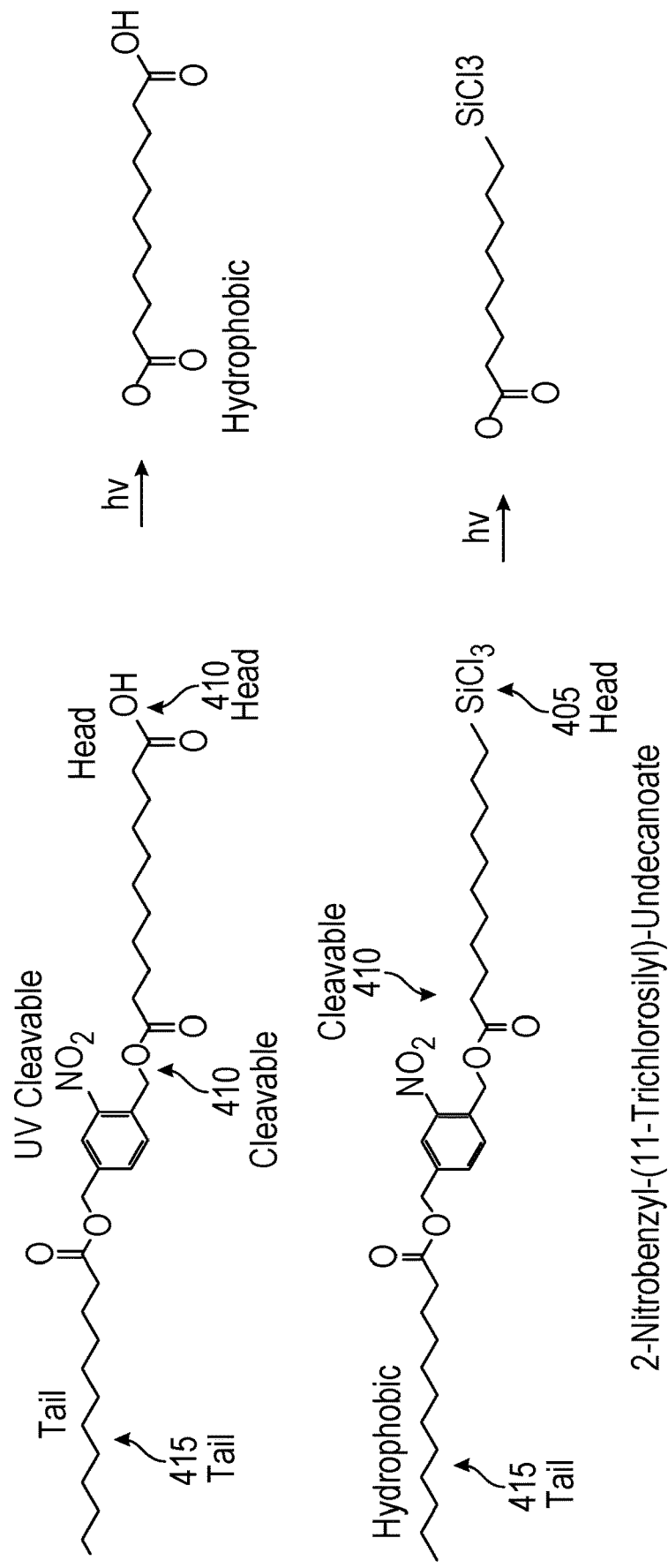
FIG. 5C shows example materials that can be used for a SAM, according to an embodiment of the present disclosure.
Figure 5D:
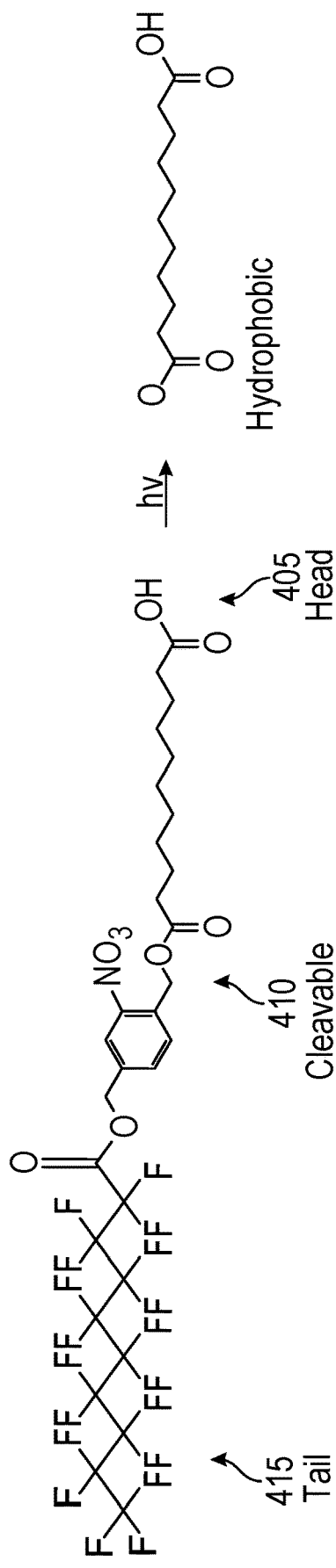
FIG. 5D shows another example chemistry that can be used for a SAM, according to an embodiment of the present disclosure.
Figure 5D:
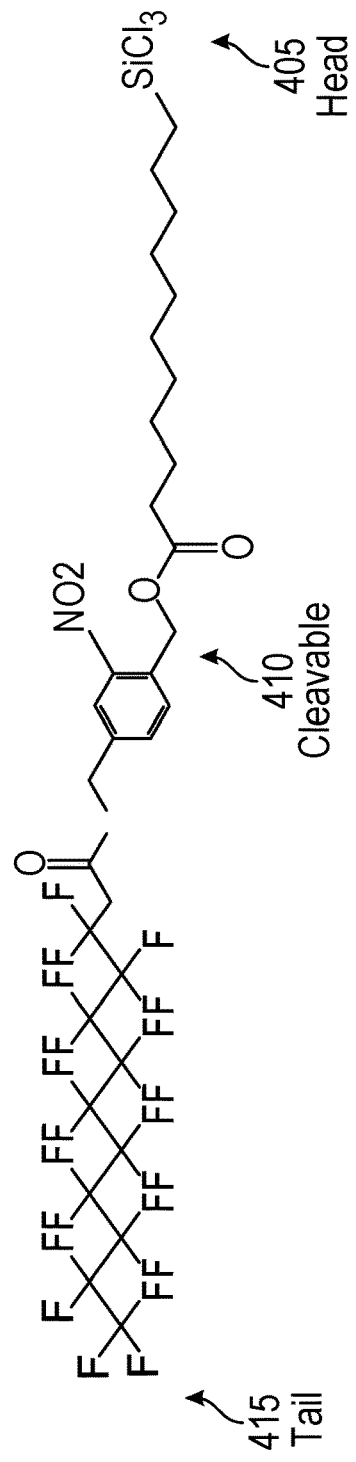

FIGS. 5A-5D show example materials that can be used herein for the SAM 215 molecule, according to an embodiment of the present disclosure. FIG. 5A shows a non-limiting example of the head 405 and the tail 415 groups, according to an embodiment of the present disclosure. For example, the head 405 and tail 415 groups can include at least one of a SH (thiol), SR (sulfide), $SO_3H$ (sulfonic acid), OH (alcohol), COOH (carboxylic acid), $SiCl_3$ (silane), $Si(OR)_3$, $PO_3H_2$ (phosphonic acid), $CONH_2$ (amide), $NH_2$ (amine), and CN (nitrile). FIG. 5B shows non-limiting examples of the body 420 group, according to an embodiment of the present disclosure. For example, the body 420 group can include at least one of an aliphatic $HS(CH2)_nCH3$, aromatic $HS(C6H4)_nC6H5$, and fluorinated aliphatic $HS(CH2)_nCH3$. Note that the light (hv) can cleave the molecule at the cleavable group 410 in order to remove the tail/inhibitor 415 and allow deposition of the spacer material 220. FIG. 5C shows another example chemistry that can be used herein for the SAM 215, according to an embodiment of the present disclosure. FIG. 5C shows molecules of the SAM 215 with a hydrocarbon chain only, while FIG. 5D shows molecules of the SAM 215 with a fluorinated chain, according to an embodiment of the present disclosure. For example, the SAM 215 molecule can be 2-nitrobenzyl,3-(11-mercaptoundecanoate),5-undecane, 2-nitrobenzyl-(11-trichlorosilyl)-undecanoate, 2-nitrobenzyl,3-(11-fluoromercaptoundecanoate),5-undecane, or 2-nitrobenzyl-(11-trichlorosilyl)-fluoroundecanoate, among others. Other examples of the head 405 group can include trichloro- and mono-hydroxy-dithiolane-based structures. Examples of the cleavable group 410 can include nitrobenzyl, carbonyl, and benzyl-based structures. Other examples of the tail/inhibitor 415 group can include alkanes that are two to thirty carbons in length and fluorinated alkanes that are two to thirty carbons in length. Notably, the fluorinated alkanes can be preferable for use with the plasma enhanced or ozone used in the ALD growth and can utilize joule-level dosage.

Figure 6:
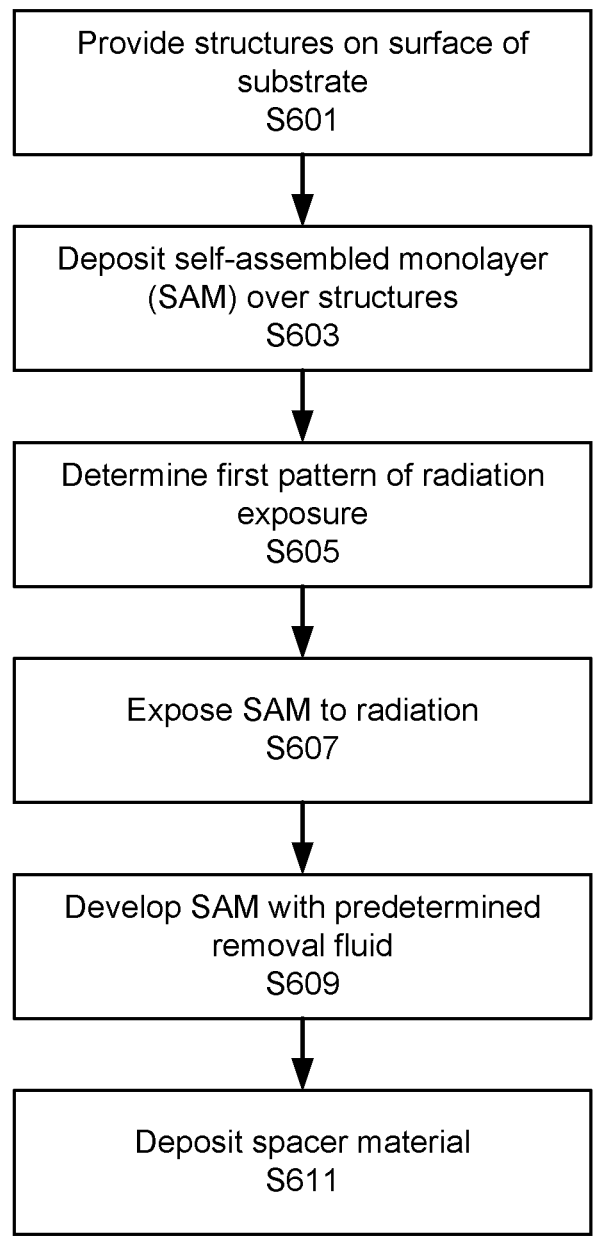
FIG. 6 shows a flow chart for a method of adjusting spacer CD, according to an embodiment of the present disclosure.

FIG. 6 shows a flow chart for a method of adjusting spacer CD, according to an embodiment of the present disclosure. In step S601, the structures 210 are provided on the surface of the substrate 205. In step S603, the SAM 215 is deposited over the structures 210 and the substrate 205. In step S605, the first pattern of radiation exposure is determined, wherein the first pattern has a spatially variable radiation intensity across the surface of the substrate 205 and the structures 210. In step S607, the SAM 215 is exposed to the radiation according to the first pattern, wherein the SAM 215 is configured to react with the radiation. In step S609, the SAM 215 is developed with the predetermined removal fluid to remove portions of the SAM 215 that are not protected from the predetermined removal fluid. In step S611, the spacer material 220 is deposited on the substrate 205 and the structures 210, wherein the spacer material 220 is deposited at varying thicknesses based on the amount of the SAM 215 remaining on the surface of the substrate 205 and the structures 210.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, the method comprising:

providing structures on a surface of a substrate;

depositing a self-assembled monolayer (SAM) over the structures and the substrate, the SAM being reactive to a predetermined wavelength of radiation;

determining a first pattern of radiation exposure, the first pattern of radiation exposure having a spatially variable radiation intensity across the surface of the substrate and the structures to provide a spatially non-uniform activation level of the SAM;

exposing the SAM to radiation according to the first pattern of radiation exposure having the spatially variable radiation intensity across the surface of the substrate and the structures, the SAM being configured to react with the radiation;

developing the SAM with a predetermined removal fluid to remove portions of the SAM that are not protected from the predetermined removal fluid; and depositing a spacer material on the substrate and the structures, the spacer material being deposited at a greater thickness in areas with more of the SAM remaining on the surface of the substrate and the structures as compared to areas with less of the SAM remaining.

2. The method of claim 1, wherein the SAM reacts to the radiation by de-protecting the SAM from the predetermined removal fluid.

3. The method of claim 2, wherein the predetermined removal fluid for developing the SAM includes at least one of a solvent, a base, or any combination thereof.

4. The method of claim 1, wherein the SAM reacts to the radiation by protecting the SAM from the predetermined removal fluid.

5. The method of claim 4, wherein the radiation increases cross-linking at an exposed portion of the SAM.

6. The method of claim 4, wherein
the portions of the SAM that are not protected from the predetermined removal fluid are portions having not been exposed to the radiation; and
developing the SAM includes removing the unexposed portions.

7. The method of claim 4, wherein the predetermined removal fluid for developing the SAM includes at least one of a solvent, a base, or any combination thereof.

8. The method of claim 1, wherein
the first pattern of radiation exposure is based on a critical dimension (CD) signature; and
the CD signature characterizes CD values of the structures across the substrate at coordinate locations.

9. The method of claim 8, wherein the CD signature is determined from simulation results, the simulation results determining the CD values of resulting structures from the deposition of the spacer material without the SAM deposition and developing.

10. The method of claim 8, wherein the CD signature is determined from metrology of the structures prior to deposition of the SAM.

11. The method of claim 8, wherein the CD signature is determined from metrology of resulting structures from another substrate having had the spacer material deposited without the SAM deposition and developing.

12. The method of claim 1, wherein depositing the spacer material is performed using plasma enhanced deposition.

13. The method of claim 1, wherein depositing the spacer material is performed using an ozone process.

14. The method of claim 1, wherein
the structures include a first structure and a second structure,
the first pattern of radiation exposure exposes the SAM deposited over the first structure more than the second structure and more of the SAM deposited over the first structure is removed than the SAM deposited over the second structure, and
the method further comprises
recessing the spacer material below a top of the first structure and the second structure to form a first spacer and a second spacer adjacent to the first structure and a third spacer and a fourth spacer adjacent to the second structure, the first spacer and the second spacer having a width greater than a width of the third spacer and the fourth spacer based on the spatially variable radiation intensity according to the first pattern of radiation exposure; and
removing the first structure and the second structure.

15. A method of multi patterning a semiconductor substrate, comprising:
providing a substrate having microstructure mandrels formed across a surface of the substrate;
depositing a self-assembled monolayer (SAM) material on the surface of the substrate to cover the mandrels, said SAM material being reactive to light radiation;
exposing the SAM to light having a spatially variable activating intensity that is a gradient across the surface of the substrate to provide a spatially non-uniform activation level of the SAM;
developing the SAM with a removal fluid that removes an amount of the SAM material based on the activation level provided by the exposing; and
depositing a spacer material on the substrate and the microstructures, the spacer material being deposited at a greater thickness in areas with more of the SAM remaining on the surface of the substrate and the microstructures as compared to areas with less of the SAM remaining.

16. The method of claim 15, wherein said exposing comprises exposing the SAM to light while changing at least one of an intensity and a wavelength of the light across the surface of the substrate to provide the spatially non-uniform activation level of the SAM.

17. The method of claim 15, wherein said exposing comprises causing the SAM to have hydrophilic or hydrophobic characteristics across the surface of the substrate.

18. A method of processing a substrate, the method comprising:
providing structures on a surface of a substrate;
depositing a self-assembled monolayer (SAM) over the structures and the substrate, the SAM being reactive to a predetermined wavelength of radiation;
determining a first pattern of radiation exposure, the first pattern of radiation exposure having a spatially variable radiation intensity across the surface of the substrate and the structures;
exposing the SAM to radiation according to the first pattern of radiation exposure, the SAM being configured to react with the radiation by protecting the SAM from the predetermined removal fluid;
developing the SAM with a predetermined removal fluid to remove portions of the SAM that are not protected from the predetermined removal fluid; and
depositing a spacer material on the substrate and the structures, the spacer material being deposited at varying thicknesses based on an amount of the SAM remaining on the surface of the substrate and the structures.

* * * * *

UNITED STATES PATENT AND TRADEMARK OFFICE
CERTIFICATE OF CORRECTION

| | |
|---|---|
| PATENT NO. | : 11,567,407 B2 |
| APPLICATION NO. | : 16/586011 |
| DATED | : January 31, 2023 |
| INVENTOR(S) | : Farrell et al. |

It is certified that error appears in the above-identified patent and that said Letters Patent is hereby corrected as shown below:

On the Title Page

Column 2, Item (56), under "OTHER PUBLICATIONS", Line 2, delete "Semconductor" and insert -- Semiconductor --, therefor.

Signed and Sealed this
Seventeenth Day of October, 2023

Katherine Kelly Vidal
*Director of the United States Patent and Trademark Office*